United States Patent [19]

Fathauer et al.

[11] Patent Number: 5,421,958

[45] Date of Patent: Jun. 6, 1995

[54] SELECTIVE FORMATION OF POROUS SILICON

[75] Inventors: Robert W. Fathauer, Sunland; Eric W. Jones, Pacoima, both of Calif.

[73] Assignee: The United States of America as represented by the Administrator of the United States National Aeronautics and Space Administration, Washington, D.C.

[21] Appl. No.: 73,019

[22] Filed: Jun. 7, 1993

[51] Int. Cl.⁶ .......................................... H01L 21/00
[52] U.S. Cl. ...................................... 216/48; 216/99; 216/87
[58] Field of Search ............... 156/662, 648, 654, 657; 252/79.1

[56] References Cited

U.S. PATENT DOCUMENTS

| | | | |
|---|---|---|---|
| 4,016,017 | 4/1977 | Aboaf et al. | 148/187 |
| 4,380,865 | 4/1983 | Frye et al. | 29/576 W |
| 4,532,700 | 8/1985 | Kinney et al. | 29/576 W |
| 4,628,591 | 12/1986 | Zorinsky et al. | 29/576 W |
| 4,874,484 | 10/1989 | Foell et al. | 204/129.3 |
| 4,910,165 | 3/1990 | Lee et al. | 437/90 |
| 4,911,783 | 3/1990 | Voboril | 156/643 |
| 4,995,954 | 2/1991 | Guilinger et al. | 204/129 |
| 5,023,200 | 6/1991 | Blewer et al. | 437/187 |
| 5,103,288 | 4/1992 | Sakamoto et al. | 357/71 |
| 5,155,576 | 10/1992 | Mizushima | 357/71 |
| 5,156,896 | 10/1992 | Katoh et al. | 428/81 |

FOREIGN PATENT DOCUMENTS

| | | |
|---|---|---|
| 3923595 | 12/1990 | Germany . |
| 58-197740 | 11/1983 | Japan . |
| 59-019350 | 1/1984 | Japan . |
| 59-039044 | 3/1984 | Japan . |
| 60-111438 | 6/1985 | Japan . |
| 61-94338 | 5/1986 | Japan . |
| 63-231637 | 9/1988 | Japan . |
| 1-217941 | 8/1989 | Japan . |

OTHER PUBLICATIONS

C. Pickering, M. I. J. Beale, D. J. Robbins, P. J. Pearson, and R. Gree, J. Phys. C. 17, 6535 (1984).
H. Robbins, B. Schwartz, J. Electrochemical Soc. 6–1959, pp. 505; 12–76, 1903.
R. W. Fathauer, T. George, A. Ksendzov, and R. P. Vasquez, Appl. Phys. Lett. 60 (8), 24 Feb. 1992.
M. I. J. Beale, J. D. Benjamin, M. J. Uren, N. G. Chew, and A. G. Cullis, J. Cryst. Growth 75, 408 (1986).
S. K. Gliandi, VLSI Fabrication Principles (Wiley, New York, 1983) pp. 478–482.
R. P. Vasquez, R. W. Fathauer, T. George, A. Ksendzov and T. L. Lin, Appl. Phys. Lett. 60, 1004 (1992).
L. T. Canham, Appl. Phys. Lett. 57, 1046 (1990).
R. J. Archer, J. Phys. Chem. Solids 14, 104 (1960).
A. Uhlir, Bell Syst. Tech. J. 35, 333 (1956).

*Primary Examiner*—R. Bruce Breneman
*Assistant Examiner*—George Goudreau
*Attorney, Agent, or Firm*—John H. Kusmiss; Thomas H. Jones; Guy M. Miller

[57] ABSTRACT

A pattern of porous silicon is produced in the surface of a silicon substrate by forming a pattern of crystal defects in said surface, preferably by applying an ion milling beam through openings in a photoresist layer to the surface, and then exposing said surface to a stain etchant, such as $HF:HNO_3:H_2O$. The defected crystal will preferentially etch to form a pattern of porous silicon. When the amorphous content of the porous silicon exceeds 70% the porous silicon pattern emits visible light at room temperature.

13 Claims, 2 Drawing Sheets

SELECTIVE FORMATION OF POROUS SILICON

ORIGIN OF THE INVENTION

The invention described herein was made in the performance of work under a NASA contract, and is subject to the provisions of Public Law 96-517 (35 USC 202) in which the Contractor has elected not to retain title.

TECHNICAL FIELD

The present invention relates to the formation of porous silicon and, more particularly, this invention relates to the selective formation of patterns of light-emitting, porous silicon on silicon substrates.

BACKGROUND OF THE INVENTION

Porous silicon produced by etching has been studied for over 30 years. Porous silicon can be oxidized to form silicon-on-insulator (SOI) structures. SOI structures provide electric insulation of active devices and are radiation hard. Photoluminesce from porous silicon was observed in 1984 (1). Recently, visible luminesces at room temperature from porous silicon has been observed (2). Stains produced in certain chemical etched (3) have been shown to consist of porous silicon. It has been shown recently that the stain films produce visible light at room temperature when radiated with ultraviolet light (5).

Interest in porous silicon has been stimulated by the observation of visible luminescence at room temperature which is consistent with the earlier measurements of photoluminescence at 4.2K from the porous silicon films produced by anodization. Stain etching of silicon in common aqueous etchants are also known to produce a film of porous silicon.

Anodic etching was carried out in aqueous HF followed by extended immersion in aqueous HF (2). The stain films produced by etching silicon in HF and $NaNO_2$ or $Cr_2O_3$ are similar to the films produced by anodic etching. This is expected since the etching of silicon in $HF:HNO_3:H_2O$ solutions is recognized to follow the same oxidation-reduction reaction chemistry as anodic oxidation. Points on the surface of the silicon behave randomly as localized anodes and cathodes.

The light-emitting porous silicon film on silicon can be the basis of optoelectronic devices such as light-emitting diodes. However, neither stain etching, nor anodic etching lend themselves readily to standard solid state device processing. Stain etches and anodic etching are non-selective, they both etch all surfaces exposed to etchant. It is difficult to prepare a high resolution pattern such as a diode by etching through an exposed mask.

In order to fabricate devices, the patterns of porous silicon need to be formed on the surface of a silicon substrate and preferably by standard photoresist and lithographic techniques and materials now used to form devices on silicon.

The use of anodic etching in aqueous HF to form porous silicon is not satisfactory. Again the formation of patterns is restricted by the application of current to the complete substrate and the difficulty of selectively forming a high resolution pattern on the surface. Anodic etching is also limited to operation on certain types of doped silicon and to a narrow range of conditions. The method is cumbersome, difficult to control, particularly for n-type structures, and is not compatible with many standard optoelectronic silicon device structures.

CITATIONS OF REFERENCES

1. C. Pickering, et al., J. Phys. C.17, 6535 (1984).
2. L. T. Canham, Appl. Phys. Lett. 57, 1046 (1990).
3. R. J. Archer, J. Phys. Chem. Solids 14, 104 (1960).
4. M. T. V. Beale, et al., J. Cryst. Growth 75, 408 (1986).
5. Vasquez, et al., Appl. Phys. Lett. 60, (8) 1992.

STATEMENT OF THE INVENTION

A method of selectively forming a pattern of porous silicon on a silicon surface is provided in accordance with the invention. The method can operate on doped or undoped silicon of high or low resistivity and can form the pattern in high resolution on silicon surfaces having different crystal orientations. The method can be performed on planar or non-planar surfaces and does not require use of current to electrolytically add or remove material.

In order to fabricate devices, a pattern of porous silicon is selectively formed on the surface of a silicon substrate, preferably by standard resist and lithographic techniques now used to form devices on silicon.

The process for selective formation of a pattern of light emitting porous silicon is based on the recognition that etching in single crystal substances preferentially attacks crystal defects. The invention exploits this phenomena by 20 forming a pattern of damaged crystal in the surface of a single crystal. When the surface is exposed to etchant, the damaged pattern forms a film of porous silicon very quickly before forming a visible film on the non-damaged areas of the surface adjacent to and surrounding the pattern of porous silicon formed in the damaged crystal. Patterns of porous silicon are directly produced in high resolution. The method utilizes standard solid state device fabrication techniques to define the pattern by masking and photolithographic steps. The surface is then contacted with chemical or anodic etchant capable of forming porous silicon. The process of the invention appears to be insensitive to silicon wafer orientation, dopant type and resistivity of the substrate material.

While the pattern could be formed by mechanically scribing the surface, techniques in which the damage is applied to the surface by energetic beams is more adapted to automated processing and fabrication of multiple devices on a single substrate. Standard processing tools that could be used to form the pattern of damage in the surface of silicon include plasma etching, ion implantation and ion milling.

A wafer is coated with a layer of photoresist. A pattern is formed in the photoresist layer and windows are opened in the photoresist in the form of a pattern. A beam such as an argon ion milling beam is then applied to the surface to damage the crystal exposed through the window-pattern. The photoresist is removed and the surface is exposed to etchant. A film of porous silicon is selectively formed in the damaged pattern.

The etchant can be a simple etchant such as a combination of hydrofluoric acid with an oxidizing acid or salt such as a nitrate, nitrite or chromate or can be hydrofluoric acid electrolyte with the substrate connected in an electrolyte cell as an anode.

The anodic etching procedure is more cumbersome, difficult to control, particularly for n-type substrates and is not compatible with many standard silicon device structures. Chemical stain etches are found to react well with n-type silicon and p-type silicon and are compatible with a wider range of device structures. The method of the invention provides the selective production of luminescent material using only standard silicon processing apparatus and chemicals which are readily available.

The pattern of porous silicon can be oxidized to form a silicon-on-insulator (SOI) structure. The pattern of light-emitting, porous silicon can directly be fabricated into light-emitting devices. The process of the invention employs standard chemical techniques and chemicals used in silicon devices and can immediately be applied to manufacture of silicon light-emitting devices used in optical fiber communications, optical switches or other devices. The invention can also be utilized to form light emitting diodes which when integrated with other silicon devices will find use in displays, communication and computer applications.

These and many other features and attendant advantages of the invention will become apparent as the invention becomes better understood by reference to the following detailed description when considered in conjunction with the accompanying drawings.

DETAILED DESCRIPTION OF THE INVENTION

Figure 1A:
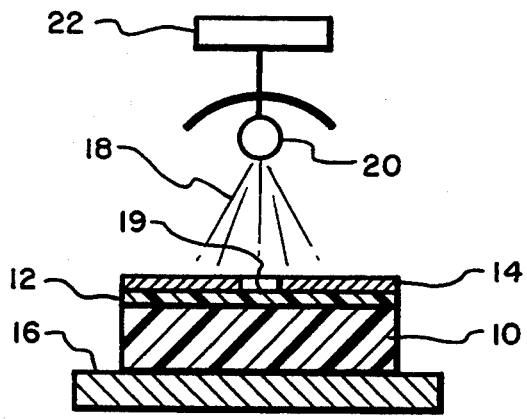
FIG. 1a is a schematic view of a silicon chip being exposed to a beam.

The invention is based on forming a latent pattern in the surface of a silicon substrate that on exposure to etchant forms a pattern of porous silicon. The latent pattern is formed by selectively damaging the crystal on the surface in the form of the pattern to provide crystal defects that are preferentially etched to form porous silicon.

The crystal can be damaged by scratching the surface with a sharp instrument such as a diamond scribe. A pattern could be formed by stamping or translation of a scribe in the x-y axis controlled by a servomechanism. Higher resolution damage patterns can be formed by applying energetic beams to the surface.

The energy of the beams determine the depth of damage in the surface of the crystal. Implantation of ion such as at energies above 10 keV such as silicon and boron produces deep patterns of damage greater than 5000 Angstroms deep. Since most devices can be formed with films of porous silicon from 100 Angstroms to 5000 Angstroms deep, less energetic beams such as plasma and ion milling with energies with energies from about 100 volts to 1000 volts are preferred. Suitable ion milling beams can comprise argon and plasma beams can contain $CF_4$ or Ar ions. The ion dose is typically above $10^{14}$ cm$^{-2}$ suitably from 1 to 5 $10^{15}$ ions cm$^{-2}$ in order to form crystal defects that can be converted to porous silicon at an acceptable rate.

The ion beam tools can be translated across the surface of the chip to directly write a damage pattern. For purpose of automation and cost efficiency, it is preferable to form the damage patterns by opening windows in a photoresist mask layer opaque to an ion beam by lithographic techniques. The photoresist can be a positive or negative photoresist. The uncured areas of the mask are removed with solvent to form windows exposing the silicon substrate. An energetic ion beam is then applied to the surface of the silicon substrate exposed through the windows. The mask is then removed and the surface exposed to etchant. The damage pattern quickly reacts to form porous silicon.

The etchant conditions for preferentially forming porous silicon in the portions of the layer containing the crystal with defects are not critical. Etching for SOI structures is conducted until the crystallization of the porous silicon film is at least 50%. Amorphous structure above 60% to about 80% is necessary for visible room temperature luminescence. The etchant contains aqueous hydrofluoric acid in which the HF concentration is at least 5% by weight, usually 20–80% by weight. Chemical stain etchants which do not require anodization of the silicon, usually contain a minor amount of an oxidizing acid such as nitric, nitrous or chromate, usually 0.1 to 40 g of oxidizing acid per 100 g of HF. The oxidizing acid can be added as the acid or as a water soluble salt such as a sodium salt of the $NO_3^{-1}$ $NO_2^{-2}$ or $CrO_3^{-2}$ ions. Preferred stain etchants are based on the $HF:HNO_3:H_2O$ system in which the ratios of $HF:HNO_3:H_2O$ are preferably from 0.5–8:1–5:10.

The silicon substrate is preferably a highly pure monocrystalline material absent any significant number of crystal defects. The substrate may be a chip cut or sliced from a rod or ribbon pulled from a melt. The substrate can also be a layer of crystalline silicon deposited on a base of another material. The silicon can be n-type or p-type and can be doped with atoms such as boron or phosphorous. The resistivity of the silicon crystal is typically from 0.01 ohm-cm to 5 ohm-cm.

Referring now to FIG. 1a, a silicon chip 10 containing a photoresist layer 12 and a mask 14 is placed in a holder 16 under a light source 20. The mask 14 may be in contact with the resist layer 12 or may be spaced a distance from the resist layer 12.

Figure 1B:
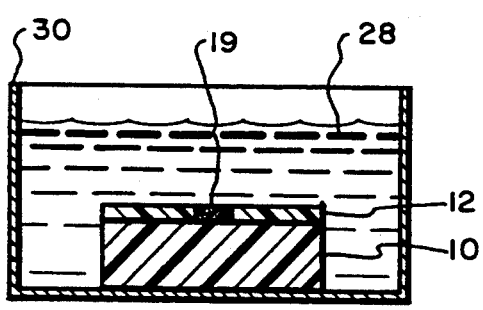
FIG. 1b is a schematic view of the silicon chip immersed in developer for the resist layer.
Figure 1C:
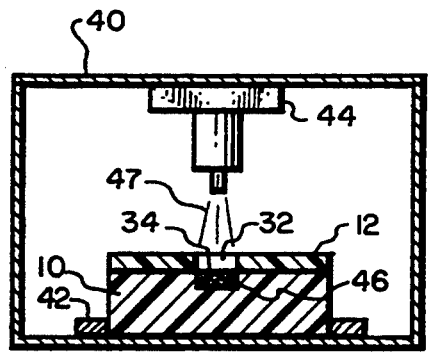
FIG. 1c is a schematic view of the chip being exposed to an energetic beam through the opening in the resist layer.

When the power supply 22 is turned on, the beam 18 generated by the light source 20 penetrates the window 19 in the mask 14 and reacts with the resist layer 12 to cure the resist 21 underlying the opening 19 in the mask. The mask 14 is removed and as shown in FIG. 1b, the chip 10 and resist 12 layer are exposed to solvent 28 in tank 30. The solvent dissolves the negative resist exposed to the light to form a window pattern 32 in the resist layer exposing the surface 34 of the chip 10.

Figure 1D:
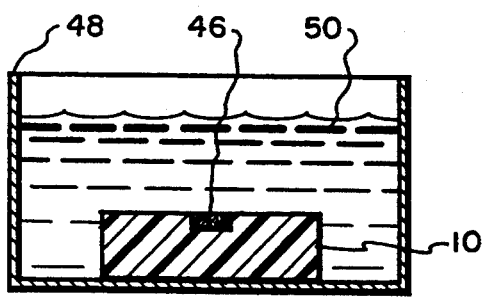
FIG. 1d is a schematic view of the silicon chip immersed in etchant.
Figure 1E:
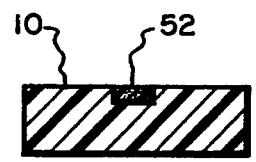
FIG. 1e is a schematic view of the silicon chip containing a porous silicon pattern.

The chip 10 is then placed in a holder 42 in an ion beam chamber 40. An ion beam source 44 is activated to radiate a beam 47 at the resist layer 12. The beam enters the window pattern 32 to form a latent damage pattern 46 in a layer adjacent the surface. The resist layer is then removed by solvent or etching in gas and the chip is placed in a bath 48 containing stain etchant 50 as shown in FIG. 1d. A pattern 52 of porous silicon is formed as shown in FIG. 1e.

The invention will now be illustrated by examples illustrating the selective formation of patterns of porous silicon films on the surface of single crystal silicon substrates.

Most of the films were produced by immersion of Si substrates in solutions of HF:HNO$_3$:H$_2$O with ratios of either 1:5:10 or 4:1:5 by volume. Reagents used were standard electronic-grade 49% HF and 70–71% HNO$_3$, and the water was deionized. Some films were also produced in solutions of either 2 grams of NaNO$_2$ in 100 ml of HF or 0.2 grams of CrO$_3$ in 100 ml of HF. Etching was carried out in polypropylene beakers with no intentional heating of the solutions, and etch durations typically ranged from 30 seconds to 10 minutes. The etching of Si in HF:HNO$_3$:H$_2$O solutions is autocatalyzed by HNO$_2$, so that in fresh solutions a quiescent period of several minutes can persist before significant etching occurs. In order to accelerate the process, the solutions were usually primed by briefly etching a piece of Si in a concentrated solution prior to adding the deionized water. The solution then contained sufficient HNO$_2$ that staining of subsequent samples began much sooner. Silicon wafers with several different combinations of dopant type, resistivity, and crystallographic orientation were used as substrates, as delivered by the manufacturers (without additional cleaning). Under some conditions of etching etchant gas evolved and poorly controlled brown-black films were formed. Stain films were observed visually to luminesce red to orange at room temperature under ultraviolet irradiation at 365 nm. In addition, all stained films etched in these solutions were observed to be hydrophobic.

Wafer types etched in HF:HNO$_3$:H$_2$O solutions include 0.05 Ω-cm B-doped Si(100), 0.05 Ω-cm B-doped Si(111), 1–10 Ω-cm B-doped Si(111), 1–3 Ω-cm B-doped Si(100), 3–5 Ω-cm P-doped Si(111), and 1–3 Ω-cm P-doped Si(100).

Figure 2:
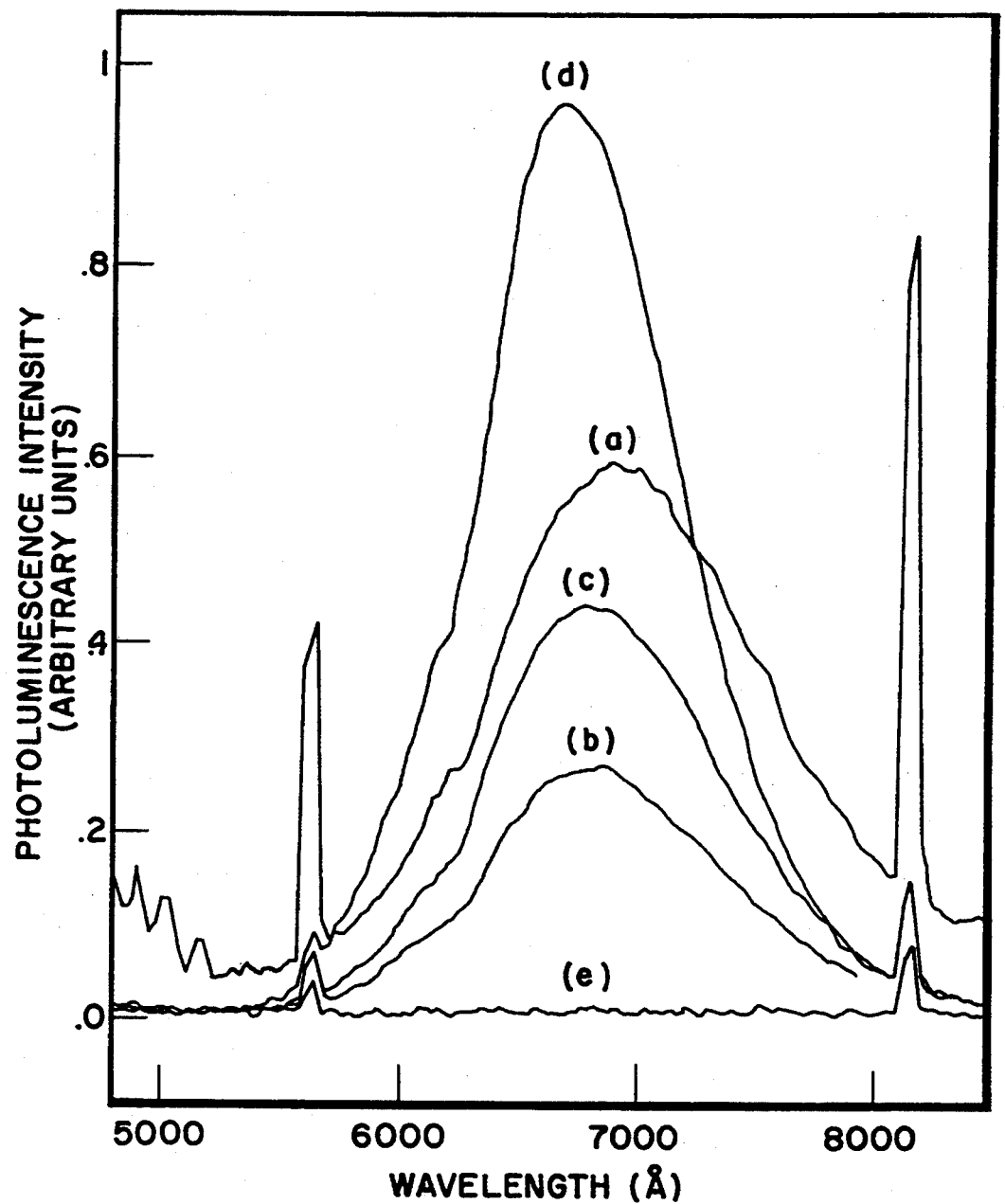
FIG. 2 are photoluminescence spectra of porous silicon films.

Stain films were formed in HF:HNO$_3$:H$_2$O solutions without visible gas evolution at the Si surface. In this case, the films exhibit color bands with increasing thickness, as observed for SiO$_2$ films on Si, for example. In particular, under white light the samples sequentially appear brown, blue, clear (silicon colored), yellow, etc., with increasing etch duration. To the naked eye, under ultraviolet irradiation the samples are first observed to luminesce a dull red when they appear clear in white light, then to luminesce orange when they appear light yellow in white light, and finally to luminesce bright orange when they are thicker. This film exhibits a much more planar surface than the brownish-black films as well as uniform thickness, though occasional dips in the interface were observed. Photoluminescence spectra of samples which display various colors under white light are shown in FIG. 2.

FIG. 2a is a photoluminescence spectrum of a film produced by etching 0.05 Ω-cm B-doped Si(100) in 1:5:10 HF:HNO$_3$:H$_2$O, FIGS. 2b–d are spectra of films produced by etching 1–3 Ω-cm B-doped Si(100) in 4:1:5 HF:HNO$_3$:H$_2$O, with spectra taken in brown/dark blue, blue/light blue, and yellow regions, respectively, and FIG. 2e is the spectrum of a film produced by etching 0.05 Ω-cm B-doped Si(111) in CrO$_3$ in HF, this film did not luminesce. The sharp peaks at approximately 5630 and 8140Å originate from the laser radiation scattered off the surface of the sample.

X-ray photoelectron spectroscopy (XPS) analysis of the brownish/black and yellow samples show that the porous film is essentially silicon and is amorphous. Pores appear to be in the nanometer range.

EXAMPLE 1

Local damage was created on the surface of a B-doped silicon wafer. The wafer was immersed in a HF:HNO$_3$:H$_2$O (4:1:5) by volume etchant. The damaged area formed a porous silicon stain film very quickly, before a visible film formed on the wafer as a whole. The stained region was verified to luminesce in the red under ultraviolet radiation.

EXAMPLE 2

B-doped silicon wafers were coated with photoresist and patterned lithographically to open windows in the photoresist layer.

EXAMPLE 3

Silicon wafers produced in Example 2 were subjected to a plasma etching in CF$_4$ and Ar to form a damage pattern in the silicon crystal under the window. The plasma-etched regions were then etched as in Example 1. Porous silicon formed faster in the plasma-damaged regions but selectivity was not great enough to allow formation of light-emitting silicon in the damaged regions before etching occurred in the undamaged regions of the surface.

EXAMPLE 4

Silicon and boron ions were implanted through the window of the resist layer of the chips of Example 2 into the silicon surface at an energy of 15 keV and at a dose of $10^{15}$ cm$^{-2}$. The samples were then etched under the conditions of Example 1. The sample implanted with boron was illuminated under both white and ultraviolet light. Under ultraviolet light the porous silicon pattern luminesced red-orange to the naked eye.

EXAMPLE 5

The surface of the silicon ship exposed through the window to an argon ion milling beam at about 100 V to form a damage pattern having a depth below 1000 Angstroms. The surface of the chip was then etched under the conditions of Example 1. The damaged pattern selectively etched to form a light-emitting, porous silicon pattern.

The selective formation of light-emitting porous silicon was successfully conducted under a variety of implant conditions. The process of the invention is capable of forming finely detailed light-emitting porous silicon patterns in the micron range, the small features of which are only limited by photolithography.

It is to be realized that only preferred embodiments of the invention have been described and that numerous substitutions, modifications and alterations are permissible without departing from the spirit and scope of the invention as defined in the following claims.

We claim:

1. A method of forming a pattern of porous silicon which emits visible light in a surface layer of single crystal silicon, comprising the steps of:
   depositing a photoresist layer on the single crystal silicon surface;
   forming a window in the shape of said pattern in said photoresist layer;
   applying an energetic beam capable of causing defects in said single crystal to the surface of the photoresist layer, whereby the beam enters the windows and damages a layer of the crystal on said surface in the shape of said pattern;

removing said photoresist layer; and selectively etching said damaged crystals in said pattern while not etching undamaged single crystal silicon adjacent said pattern by applying an etchant to said surface whereby said pattern of crystal defects selectively etches to form a pattern of light emitting porous silicon having at least 60% amorphous structure.

2. A method according to claim 1 in which the structure of said porous silicon is at least 70% amorphous.

3. A method according to claim 2 in which the porous silicon emits visible light at room temperature.

4. A method according to claim 1 in which said surface is etched in a stain etchant.

5. A method according to claim 4 in which the etchant comprises aqueous hydrofluoric acid containing a minor amount of oxidizing material.

6. A method according to claim 5 in which the oxidizing material is selected from acids or salts of $CrO_3$, $NO_2$ or $NO_3$ ions.

7. A method according to claim 6 in which the oxidizing material is $HNO_3$.

8. A method of forming a pattern of porous silicon which emits visible light in a surface layer of single crystal silicon, comprising the steps of:

damaging a layer of the crystal on said surface in said pattern by selectively applying an energetic ion beam containing 1 to $5 \times 10^{15}$ ions $cm^{-2}$ capable of causing crystal defects in said layer to said surface in the shape of said pattern; and selectively etching said damaged crystals in said pattern while not etching undamaged single crystal silicon adjacent said pattern to form a pattern of light emitting porous silicon having at least 60% amorphous structure.

9. A method according to claim 8 in which the ion beam has an energy below 1000 volts.

10. A method according to claim 1 in which the beam is an ion beam.

11. A method according to claim 10 in which the pattern of light emitting porous silicon has a thickness from 100 Angstroms to 5000 Angstroms.

12. A method according to claim 11 in which the ion beam contains at least $10^{14}$ $cm^{-2}$ ions.

13. A method according to claim 12 in which the beam is selected from an ion beam comprising argon and a plasma beam containing $CF_4$ or Ar ions.

* * * * *